(12) United States Patent
Lai et al.

(10) Patent No.: US 10,916,293 B1
(45) Date of Patent: Feb. 9, 2021

(54) TARGET ROW REFRESH MECHANISM CAPABLE OF EFFECTIVELY DETERMINING TARGET ROW ADDRESS TO EFFECTIVELY MITIGATE ROW HAMMER ERRORS WITHOUT USING COUNTER CIRCUIT

(71) Applicant: Elite Semiconductor Memory Technology Inc., Hsinchu (TW)

(72) Inventors: Ya-Chun Lai, Hsinchu (TW); Po-Hsun Wu, Hsinchu (TW); Jen-Shou Hsu, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 16/747,553

(22) Filed: Jan. 21, 2020

(51) Int. Cl.
| | | |
|---|---|---|
| *G11C 11/40* | (2006.01) | |
| *G11C 11/406* | (2006.01) | |
| *G11C 7/06* | (2006.01) | |
| *G06F 12/02* | (2006.01) | |
| *G11C 11/409* | (2006.01) | |

(52) U.S. Cl.
CPC .... *G11C 11/40615* (2013.01); *G06F 12/0292* (2013.01); *G11C 7/065* (2013.01); *G11C 11/409* (2013.01); *G11C 11/40607* (2013.01); *G06F 2212/7209* (2013.01)

(58) Field of Classification Search
CPC ............... G11C 11/40615; G11C 8/04; G11C 11/40618; G11C 7/065; G11C 8/18
See application file for complete search history.

(56) References Cited

U.S. PATENT DOCUMENTS

| | | | |
|---|---|---|---|
| 2005/0289293 A1* | 12/2005 | Parris | G11C 8/16 711/106 |
| 2006/0023541 A1* | 2/2006 | Sapre | G06F 5/10 365/221 |
| 2020/0090729 A1* | 3/2020 | Son | G11C 11/4082 |

* cited by examiner

*Primary Examiner* — Han Yang
(74) *Attorney, Agent, or Firm* — Winston Hsu (57) ABSTRACT

A target row refresh method includes: providing first table having M entries each capable of storing information of target row address; providing second table having K entries respectively capable of storing information of different/identical candidate row addresses; determining whether an input address in an input address register matches address information recorded in the first table; when not match, determining whether to update information of a target row latch by using the input address in the input address register according to a sample policy so as to determine whether to compare the input address with address information recorded in the second table to determine a target row address; and performing a target row refresh operation to refresh a memory device's row(s) adjacent to a target row corresponding to the target row address.

13 Claims, 5 Drawing Sheets

TARGET ROW REFRESH MECHANISM CAPABLE OF EFFECTIVELY DETERMINING TARGET ROW ADDRESS TO EFFECTIVELY MITIGATE ROW HAMMER ERRORS WITHOUT USING COUNTER CIRCUIT

BACKGROUND OF THE INVENTION

1. Field of the Invention

The invention relates to a row hammer mitigation mechanism, and more particularly to a target row refresh method and a determining circuit employed in a memory device to determine a target row address to be used by a target row refresh operation to refresh row (s) adjacent to a target row of the memory device.

2. Description of the Prior Art

Generally speaking, a hacker may attack a memory device such as DRAM by heavily accessing some row address (es) of the memory device during a specific time period such as 64 ms to cause row hammer errors. To mitigate the row hammer errors, it is needed to appropriately to determine which row address is attacked, i.e. a target row address. A conventional scheme may be arranged to use multiple counter circuits to respectively count the total numbers of all different input row addresses received during the time period. For example, the conventional may adopt N counter circuits to count the total numbers of N different input row addresses received during the time period, and the value of N may be large if the hacker carefully design more different row addresses to cover a target row address which is heavily accessed by the hacker. More circuit areas of the memory device will be occupied if more counter circuits are implemented.

SUMMARY OF THE INVENTION

Therefore one of the objectives of the invention is to provide a target row refresh method and a determining circuit employed in a memory device to determine a target row address to be used by a target row refresh operation to refresh row(s) adjacent to a target row of the memory device, to solve the above-mentioned problems.

According an embodiment, a target row refresh method is disclosed. The method comprises: (a) providing and using a first first-in-first-out (FIFO) buffer used as a first table having M entries each being capable of storing information of a target row address; (b) providing and using a second FIFO buffer used as a second table having K entries which are respectively capable of storing information of different/ identical candidate row addresses; (c) providing an input address register to receive an input address; (d) determining whether the input address in the input address register matches address information recorded in the first table; (e) when the input address does not match the address information recorded in the first table, determining whether to update information of a target row latch by using the input address in the input address register according to a sample policy so as to determine whether to compare the input address with address information recorded in the second table to determine a target row address; and (f) when the target row address is determined, performing a target row refresh operation to refresh a memory device's row(s) adjacent to a target row corresponding to the target row address.

According to an embodiment, a determining circuit employed in a memory device to determine a target row address to be used by a target row refresh operation to refresh row(s) adjacent to a target row of the memory device is disclosed. The determining circuit comprises a first FIFO buffer, a second FIFO buffer, an input address register, a first comparison circuit, and a target row latch. The FIFO buffer is used as a first table having M entries each being capable of storing information of a target row address. The second FIFO buffer is used as a second table having K entries which are respectively capable of storing information of different/ identical candidate row addresses. The input address register is used for receiving an input address. The first comparison circuit is coupled between the first FIFO buffer and the input address register, and is used for comparing the input address in the input address register with address information recorded in the first table to determine whether the input address matches the address information recorded in the first table. The target row latch is coupled to the input address register and the second FIFO buffer, and is to be controlled by the determining circuit to determine whether to update information of the target row latch by sampling the input address in the input address register according to a sample policy so as to determine whether to compare the input address with address information recorded in the second table to determine a target row address when the input address does not match the address information recorded in the first table.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a technical solution/ mechanism of capable of effectively mitigating row hammer errors for a dynamic random access memory (DRAM) as well as reducing computation complexity and circuit area by selecting one or more target row addresses to perform the target row refresh operation based on the statistical concept/ results. In addition, the provided technical solution/mechanism can cope with the problems of multi-bank short tRAS (row active time, i.e. the minimum number of clock cycles required between a row active command and issuing the pre-charge command).

In one embodiment, the provided technical solution/mechanism is used to divide a longer time period having a specific time length such as 64 ms into a plurality of shorter iteration periods, and each for example is equal to N times tREFI wherein N for example is equal to 16 (but not limited) and one tREFI period (tREFI indicates the time of the refresh interval) is equal to 64 ms divided by 8192, i.e. 7.8 us. In this embodiment, the longer time period having the specific time length such as 64 ms is for example divided into 512 iteration periods (but not limited). For each iteration period, the provided technical solution/mechanism is arranged to decide whether to monitor one or more input addresses during the each iteration period and to select an active input address which occurs most frequently in the each iteration period if determining to monitor the input addresses so as to determine a target row address for the each iteration period based on identical/different policies/parameters and statistical concept/results. Then, in a next iteration period, the provided technical solution/mechanism can perform the target row refresh operation based on the determined target row address. For example, a hacker may try to attack some address in 64 ms to cause row hammer errors, and based on the target row addresses respectively determined for multiple (e.g. 512) iteration periods, there is a very great probability that the provided technical solution/mechanism can correctly determine which address attacked by the hacker as a target row address and thus the target row refresh operation based on the target row address can obtain a target row and then can appropriately refresh row(s) adjacent to the heavily used row (i.e. the target row) and prevent corruption.

Figure 1:
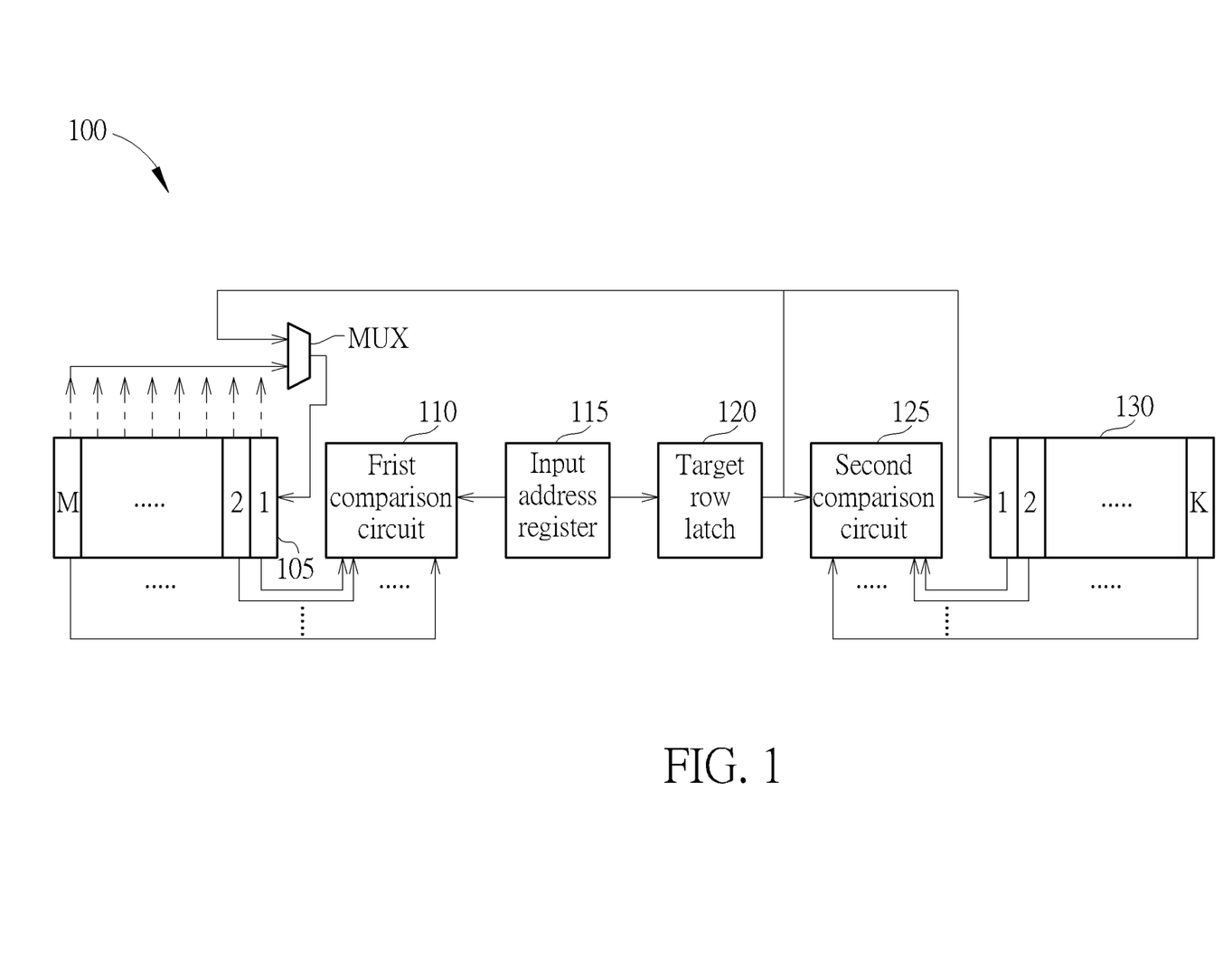
FIG. 1 is a block diagram of a determining circuit used for determining or selecting a target row address for each or an iteration period based on the statistical mechanism without using any counter circuit to save more circuit areas according to an embodiment of the invention.
Figure 2:
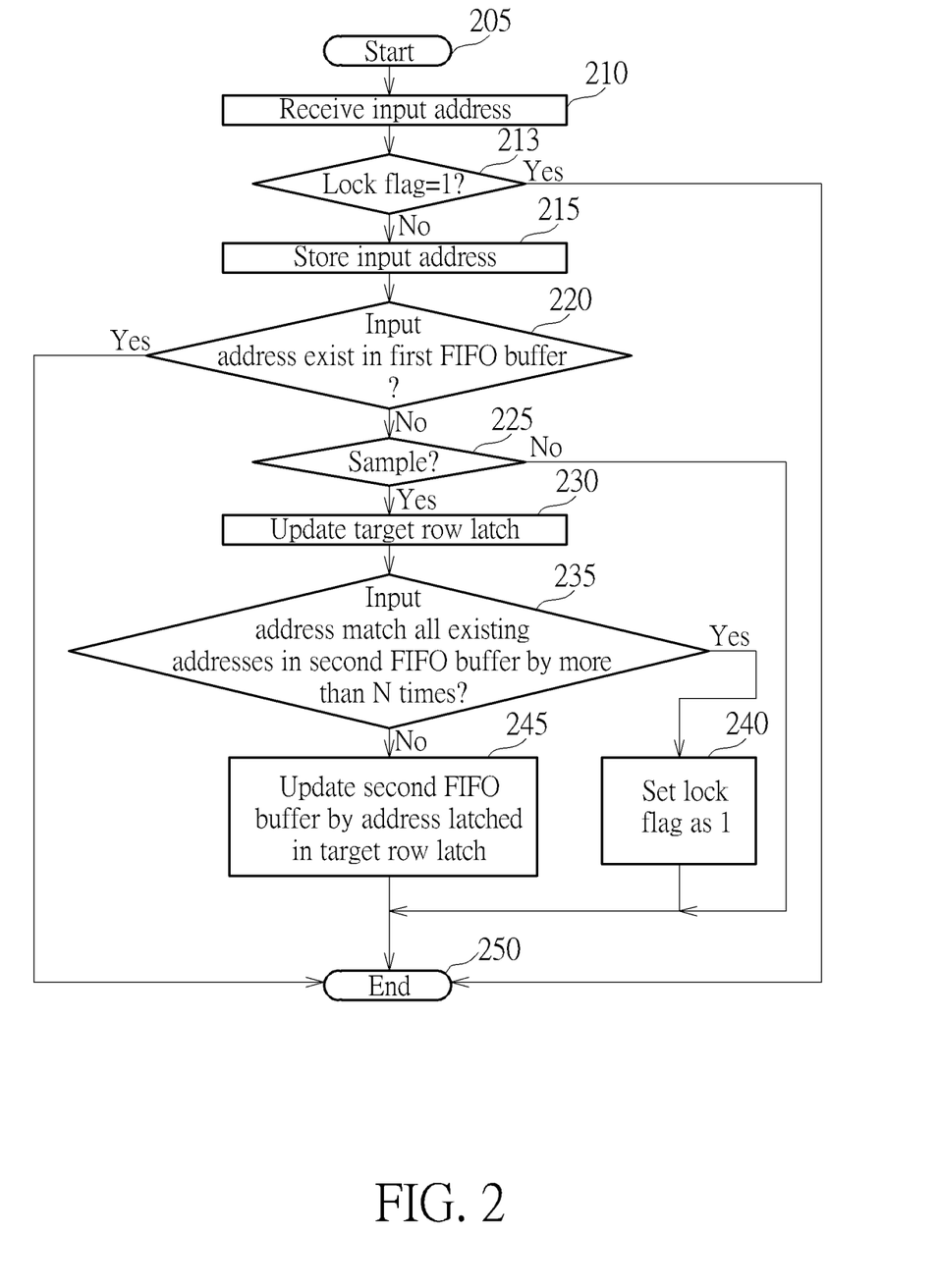
FIG. 2 is a flowchart diagram showing the operation of determining circuit of FIG. 1.

For one or each iteration period, the operation of determining which input address is the target row address is described in the following. Refer to FIG. 1 in conjunction with FIG. 2. FIG. 1 is a block diagram of a determining circuit 100 used for determining or selecting a target row address for each or an iteration period based on the statistical mechanism without using any counter circuit to save more circuit areas according to an embodiment of the invention. The determining circuit 100 comprises a first FIFO (First-In-First-Out) buffer 105, a first comparison circuit 110, an input address register 115, a target row latch 120, a second comparison circuit 125, a second FIFO buffer 130, and a multiplexer MUX. FIG. 2 is a flowchart diagram showing the operation of determining circuit 100 of FIG. 1. Provided that substantially the same result is achieved, the steps of the flowchart shown in FIG. 2 need not be in the exact order shown and need not be contiguous, that is, other steps can be intermediate. Steps are detailed in the following:

Step 205: Start;
Step 210: Receive an input address;
Step 213: Determine whether a lock flag is equal to a specific value such as '1'; if yes, the flow proceeds to Step 250, otherwise, the flow proceeds to Step 215;
Step 215: Store the input address into the input address register 115;
Step 220: The first comparison circuit 110 checks whether the input address exists in the first FIFO buffer 105. If the input address exists in the first FIFO buffer 105, then the flow proceeds to Step 250, otherwise, the flow proceeds to Step 225;

Step 225: Decide whether to sample and store the input address into the target row latch 120; if yes, the flow proceeds to Step 230, otherwise, the flow proceeds to Step 250;
Step 230: Sample the input address to update the target row latch 120;
Step 235: Determine whether the input address matches all existing addresses in the second FIFO buffer 130 by more than N times; if yes, the flow proceeds to Step 240, otherwise, the flow proceeds Step 245;
Step 240: Set the lock flag as the value '1';
Step 245: Update the second FIFO buffer 130 by the address latched in the target row latch 120; and
Step 250: End.

In practice, the first FIFO buffer 105 for example is used as a database storing information of a first table/list having M entries and the first table is used to record at most M target row addresses previously determined. For example, if an address is determined as a target row address in this iteration period, then information recorded in each of all entries excluding the last one entry is moved and stored into a next one entry, the information recorded by the last one entry (i.e. the M-th entry) is discarded, and such address is updated to the first entry of the first table/list. When such address is updated to the first entry of the first table/list at the end of this iteration period, the target row refresh operation can be performed in the next iteration period based on the target row corresponding to the target row address recorded in the first entry of the first table/list. The first FIFO buffer 105 is not cleared indifferent iteration periods. Initially, the number of valid entries of the first table implemented by the first FIFO buffer 105 is zero at the beginning of the first iteration period, wherein a valid entry means an entry that stored a valid target row address previously determined.

The second FIFO buffer 130 for example is used to store information of a second table/list having K entries each with a corresponding flag (may be implemented by using a bit), i.e., K entries with K flags. For each iteration period, the second FIFO buffer 130 is cleared at the end of a corresponding previous iteration period or at the start of the each iteration period; the second FIFO buffer 130 is empty initially at the start of each iteration period. That is, the number of valid entries of the second table is zero at the start of each iteration period wherein a valid entry in the second table means an entry that stores address information. The second FIFO buffer 130 is used to store all input addresses sampled in an iteration period before the target row address is determined in this iteration period. Accordingly, if two or more identical input addresses are sampled in this iteration period before a target row address has been determined, then the second FIFO buffer 130 will store two or more identical address information at different entries of second table/list. For each entry, the flag associated with a corresponding entry in the second table/list is used to indicate a result of whether an address information recorded in the corresponding entry matches (i.e., is equal to) a currently sampled input address or not. For example, a flag recording the value '1' means that the address information recorded in the corresponding entry matches the currently sampled input address while such flag recording value '0' means that the address information recorded in the corresponding entry does not match the currently sampled input address; however, this is not intended to be a limitation. Thus, for instance, if the currently sampled input address matches k identical addresses recorded at different entries of the second table/list, then there exist k flags recording value '1' while the other flags record value '0'. After each comparison between a currently sampled input address and the addresses which have been recorded in the second FIFO buffer 130 to determine the target row address of the iteration period, all the K flags are cleared as empty for the next round of address comparison. It should be noted that no counter circuits used for counting the numbers of different addresses are employed in the embodiments of the invention. Accordingly, the circuit areas can be significantly saved.

In Step 210, the input address register 115 is used to temporarily store the currently received input address carried by a currently received command such as an active (ACT) command sent from a host such as a central processing unit (CPU).

The lock flag implemented within the determining circuit 100 is set as '0' initially and is also set/cleared as '0' when an iteration changes. The lock flag is set as '1' when the target row address of this iteration period has been determined. Accordingly, when deciding whether to determine an input address currently received is the target row address or not, the determining circuit 100 in Step 213 is used to determine whether the lock flag is equal to '1'. If the lock flag is equal to value '1', then this indicates that the target row address of this iteration period has been determined even though the iteration does not yet change, and it is not needed to re-determine the target row address during this iteration period and thus the flow proceeds to Step 250. Instead, if the lock flag is equal to value '0', then this indicates that the target row address of this iteration period has still not been determined.

In step 215, the input address currently received is stored into the input address register 115.

The first comparison circuit 110 is coupled to the input address register 115 and used for comparing the currently received input address with the address information recorded at one or more entries of the first table/list implemented by the first FIFO buffer 105 (Step 220). If the first comparison circuit 110 determines that the currently received input address is identical to an address which has been recorded or buffered by the first FIFO buffer 105, then the first comparison circuit 110 determines that the target row address, identical to the currently received input address, has occurred in a previous iteration period and the target row refresh operation may be performed based on such target row address. Accordingly, it may not needed to determine such currently received input address as the target row address for this iteration period, and in this situation such currently received input address may be not considered as the target row address. A next input address if received will be stored and updated to the input address register 115. If the first comparison circuit 110 determines that the currently received input address is different from all addresses which have been recorded or buffered by the first FIFO buffer 105, then the first comparison circuit 110 is arranged to decide whether to update the target row latch 120 by storing the input address recorded in the input address register based on a sample policy (Step 225).

The sample policy indicates a consecutive sample policy or a discrete sample policy with a sample interval which can be changed in different iteration periods. The consecutive sample policy may mean sampling and storing each input address which is currently received, and the discrete sample policy may mean sampling and storing an input address and discarding or ignoring other input address(es). In addition, the sample policy may be changed and become different for different iteration periods. For example, the sample policy may indicate different sampling periods for different iteration periods. For instance, based on the sample policy, the determining circuit 100 or first comparison circuit 110 may control the target row latch 120 to sample and store one input address when receiving every five input addresses which are not recorded in the first FIFO buffer 105 in one iteration period while the first comparison circuit 110 may control the target row latch 120 to sample and store one input address when receiving every four input addresses which are not recorded in the first FIFO buffer 105 in the next iteration period. Alternatively, the first comparison circuit 110 may control the target row latch 120 to sample and store an input address periodically or randomly. These examples are not intended to be limitations.

After the input address is sampled by the target row latch 120 (Step 230), the second comparison circuit 125 is used to compare the sampled input address with one or more addresses currently buffered in the second FIFO buffer 130 (Step 235). The second comparison circuit 125 is used to compare the sampled input address with all addresses currently buffered by the second FIFO buffer 130 to check and record whether each address currently buffered in the second FIFO buffer 130 is equal to the sampled input address or not. As mentioned above, the k-th corresponding flag is used to indicate whether a corresponding address currently buffered by the k-th entry of the second table implemented by using the second FIFO buffer 130 is equal to the sampled input address or not after each comparison made by the second comparison circuit 125. After the comparison between one or more addresses buffered in the second FIFO buffer 130 and the sampled input address, the second comparison circuit 125 is used to collect information of all flags and to calculate the number of flags recording value '1'. The second comparison circuit 125 is used to compare the number of flags recording value '1' with a specific threshold value TH of this iteration period; for example the specific threshold value TH may be configured as two (but not limited). If the number of flags recording value '1' is equal to or larger than the specific threshold value TH, then the second comparison circuit 125 determines the sampled input address as the target row address of this iteration period. Instead, the sampled input address is not determined as the target row address of this iteration period. If the sampled input address is determined as the target row address of this iteration period, the second FIFO buffer 130 and content of all the K flags are then cleared and reset as empty. If the number of flags recording value '1' is smaller than the specific threshold value TH, then the second comparison circuit 125 is arranged to store such sampled input address into the second FIFO buffer 130. In this situation, the content of second FIFO buffer 130 is not cleared after the comparison is executed by the second comparison circuit 125 while the K corresponding flags corresponding to this comparison result are reset as empty.

When the target row address of this iteration period has been found or determined, the determining circuit 100 is arranged to set the lock flag as the value '1' (Step 240). If an input address is not considered as the target row address, then the second comparison circuit 125 uses such input address to update content of the second table/list implemented by second FIFO buffer 130 (Step 245). For example, the information of second table's all entries excluding the K-th entry is moved to corresponding next entries, and the information of such currently received input address is stored into the first entry of the second table. The information of K-th entry is discarded.

In practice, the multiplexer MUX has a first input coupled to the target row latch 120, a second input coupled to the first FIFO buffer 105, and an output coupled to the storage location corresponding to the first entry of the first FIFO buffer 105. If a currently received input address is sampled and latched by the target row latch 120 and then is determined as the target row address by the second comparison circuit 125, the target row latch 120 is controlled by the determining circuit 100 to transmit the information of the currently sampled input address to the first input of the multiplexer MUX, and the determining circuit 100 can control the multiplexer MUX selecting the signal at its first input as its output. Thus, in this situation, the currently received and sampled input address if considered as the target row address will be stored into the first entry of the first table. However, in some situation, if the target row latch 120 has never been updated during a whole iteration period (i.e. no input addresses are sampled), the determining circuit 100 is arranged to control the multiplexer MUX selecting its second input as its output. The determining circuit 100 can detect whether the target row latch 120 has been updated or not during a whole iteration period. If it is determined that the target row latch 120 has never been updated during a whole iteration period, the determining circuit 100 controls the first FIFO buffer 105 outputting/transmitting the information of the last valid entry currently buffered in the first FIFO buffer 105 to the second input of the multiplexer MUX. The corresponding flow is described in the following.

Figure 3:
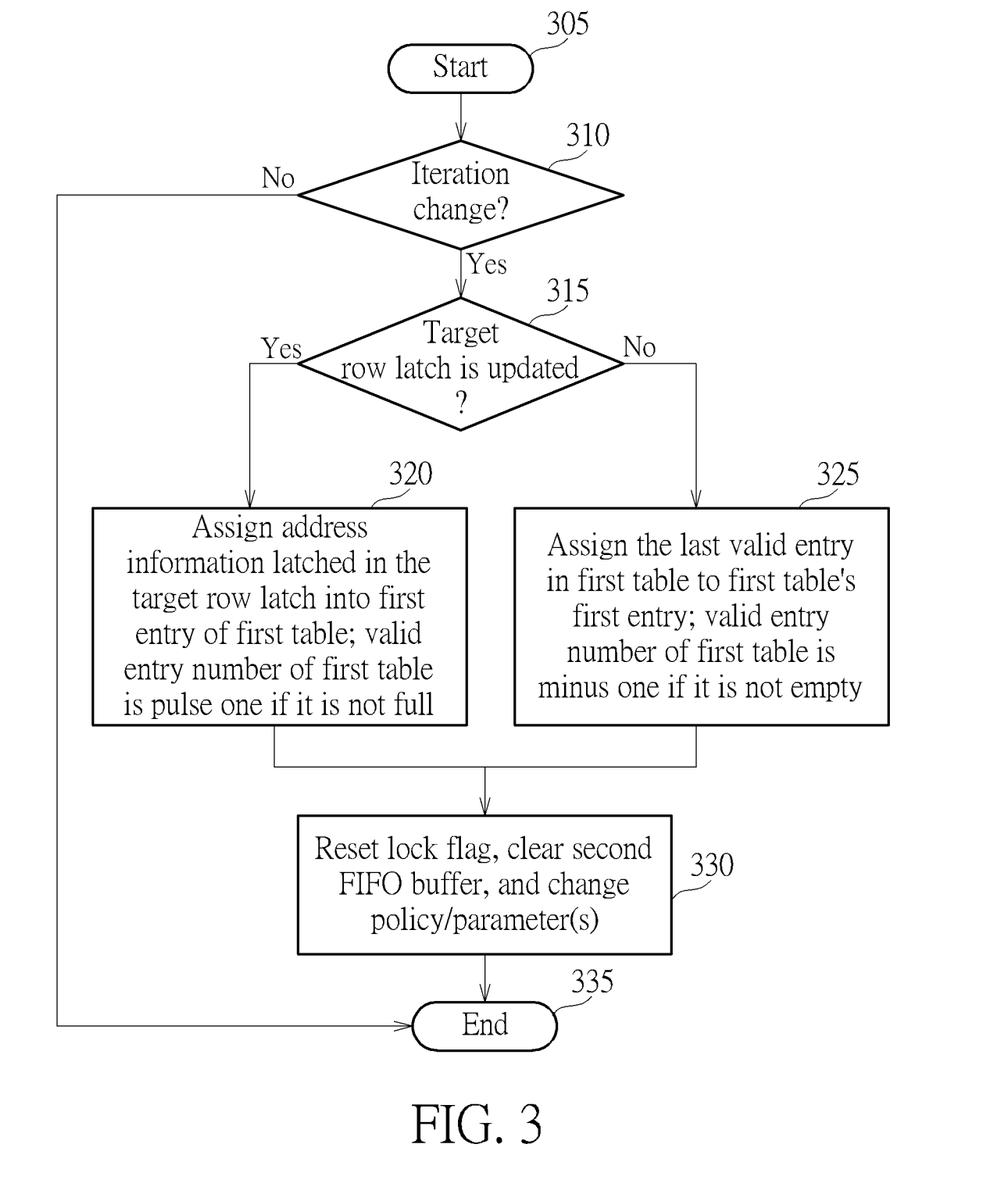
FIG. 3 is a flowchart diagram showing a scenario example of second comparison circuit still not determining the target row address of an iteration period when such iteration period ends according to an embodiment of the invention.

FIG. 3 is a flowchart diagram showing a scenario example of the determining circuit 100 updating the target row address of an iteration period when such iteration period ends according to an embodiment of the invention. Provided that substantially the same result is achieved, the steps of the flowchart shown in FIG. 3 need not be in the exact order shown and need not be contiguous, that is, other steps can be intermediate. Steps are detailed in the following:

Step 305: Start;

Step 310: Determine whether the iteration changes (i.e. Determine whether the iteration period ends); if yes, the flow proceeds to Step 315, otherwise, the flow proceeds to Step 335;

Step 315: Determine whether the target row latch 120 is updated during the whole iteration period; if yes, the flow proceeds to Step 320, otherwise, the flow proceeds to Step 325;

Step 320: The determining circuit 100 moves address information buffered in the entries of the first table to corresponding next entries respectively and controls the multiplexer MUX selecting the signal at its first input as the signal at its output to assign the address information latched in the target row latch 120 into the first entry of the first table implemented by the first FIFO buffer 105; the valid entry number of the first table is increased by one if the first table is not full;

Step 325: The determining circuit 100 moves address information buffered in the entries of the first table to corresponding next entries respectively and controls the multiplexer MUX selecting the signal at its second input as the signal at its output to assign the last address among the valid addresses currently buffered in the first table implemented by the first FIFO buffer 105 to the first table's first entry; the valid entry number of the first table is decreased by one if the first table is not empty;

Step 330: Reset the lock flag as value '0', clear the content of second FIFO buffer 130, and changes a policy/parameter (s) for a next iteration period; and Step 335: End.

Further, the operation of adjusting the parameter (s) for different iteration periods may adjust the value of the specific threshold value TH for the different iteration periods. However, this is not intended to be a limitation.

Figure 4:
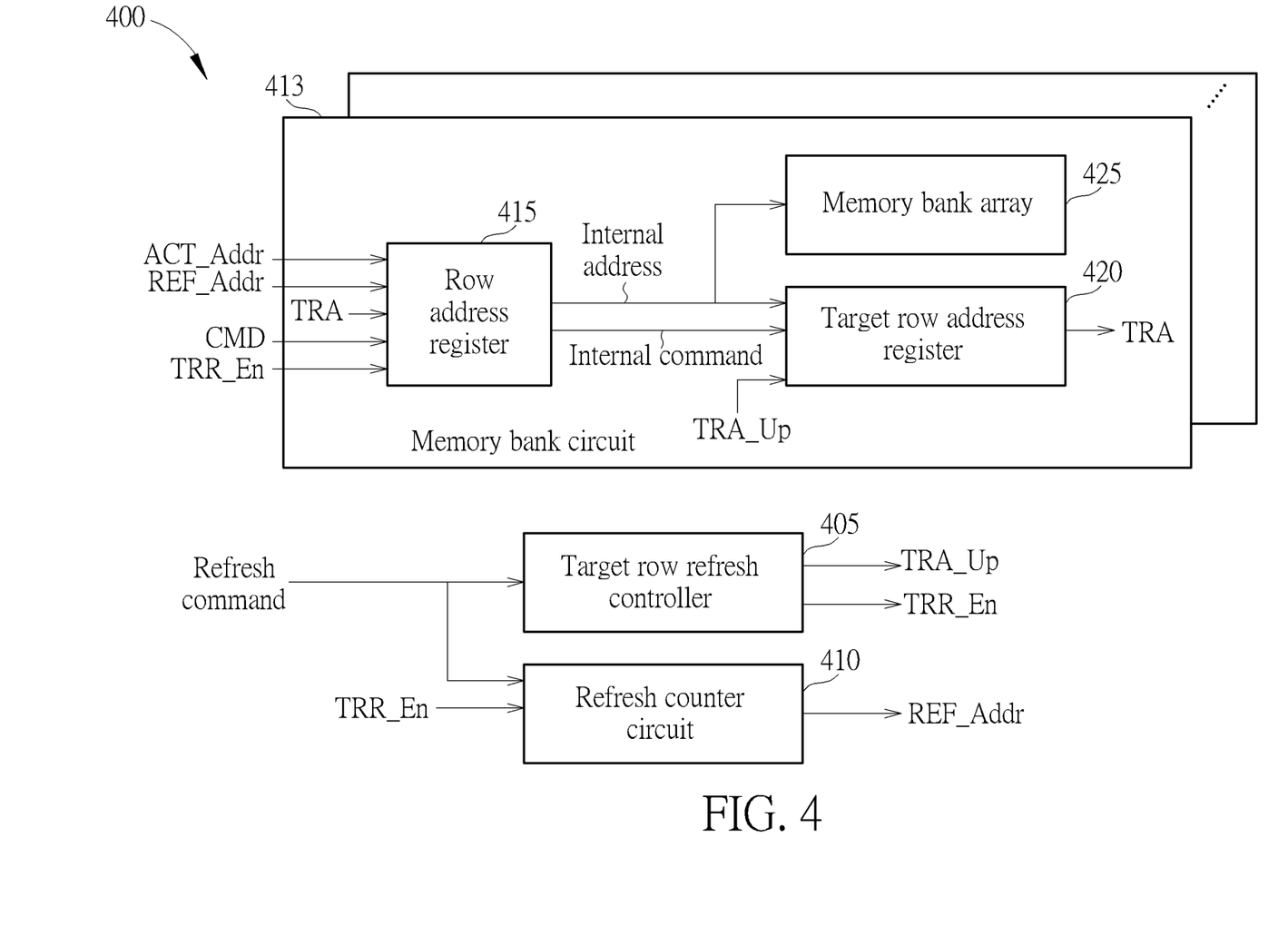
FIG. 4 is a block diagram of a memory device comprising multiple target row address generators each being implemented by using the determining circuit of FIG. 1 according to an embodiment of the invention.

FIG. 4 is a block diagram of a memory device 400 such as a DRAM comprising multiple target row address generators 420 each being implemented by using the determining circuit 100 of FIG. 1 according to an embodiment of the invention. The memory device 400 comprises a target row refresh controller 405, a refresh counter circuit 410, and multiple memory bank circuits 413 wherein the target row refresh controller 405 and refresh counter circuit 410 are periphery circuits. Each memory bank circuit 413 comprises a row address register 415, a target row address generator 420, and a memory bank array 425. The multiple memory bank circuits 413 are configured for different memory banks respectively.

For one or each memory bank circuit 413, the row address register 415 is configured to receive an input active address ACT_Addr, a refresh address REF_Addr, an input command CMD such as active command, refresh command, and/or pre-charge command, a target row refresh enable signal TRR_En, a target row address TRA generated by the target row address generator 420. Based on the above received signals, the row address register 415 generates and outputs the internal row address to the memory bank array 425, and also generates and outputs the internal row address and internal active command to the target row address generator 420.

The refresh command means an auto-refresh command, and for example one auto-refresh command may be generated every tREFI period to refresh a corresponding row. For instance, the refresh counter circuit 410 is arranged to counting from a first value to a second value once receiving one refresh command. Initially, the value of the refresh counter circuit 410 may be configured as zero, and is incremented by one to indicate which row is to be refreshed by a refresh command each time when the refresh command is received. The refresh counter circuit 410 generates the refresh address REF_Addr based on its counting value for the row to be refreshed. It should be noted that the refresh address REF_Addr is used to refresh a row corresponding to the refresh address REF_Addr for the auto-refresh command while the target row address TRA is used by the target row refresh operation to refresh adjacent row(s) of a heavily used row. The heavily used row may be identical to or different from a row corresponding to the refresh address REF_Addr.

The target row refresh controller 405 is used to receive the refresh command to generate the target row refresh update signal TRA_Up and the target row refresh enable signal TRR_En wherein the target row refresh update signal TRA_Up is received by the target row address generator 420 and the target row refresh enable signal TRR_En is received by the row address register 415. The target row refresh controller 405 may generate and output the target row refresh update signal TRA_Up when a current iteration period ends, i.e. the iteration changes (but not limited). When receiving the target row refresh update signal TRA_Up generated from the target row refresh controller 405, the target row address generator 420 is used to output the target row address TRA, i.e. the address information recorded at the first entry of the first table/list of the first FIFO buffer 105, and the target row address TRA is then sent to the row address register 415. In addition, the target row refresh controller 405 is arranged to generate and output the target row refresh enable signal TRR_En to notify the row address register 415. The row address register 415 is notified to receive the target row address TRA when the target row refresh enable signal TRR_En is asserted. If the target row refresh enable signal TRR_En is not asserted by the target row refresh controller 405, the row address register 415 is used to generate the internal row address based on the refresh address REF_Addr and a row corresponding to the internal row address is refreshed. When the target row refresh enable signal TRR_En is asserted and the target row address TRA has been received by the row address register 415, the row address register 415 is used to generate the internal row address based on the target row address TRA, and the target row refresh operation can be performed to refresh rows adjacent/neighboring to the target row (i.e. the heavily used row) corresponding to the target row address TRA to mitigate row hammer errors.

Figure 5:
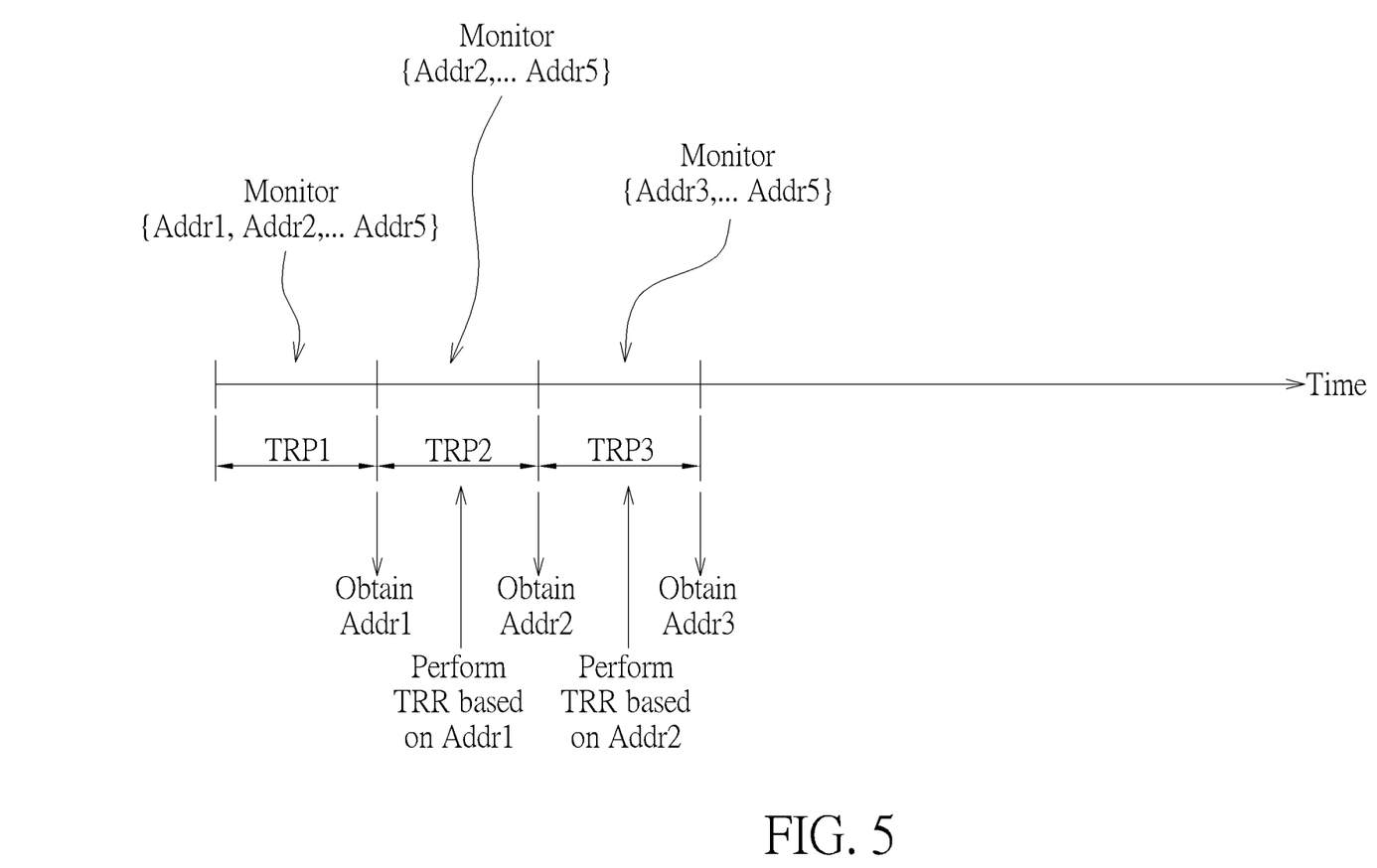
FIG. 5 is an example diagram showing a scenario of using the determining circuit to determine target row addresses of different iteration periods according to an embodiment of the invention.

FIG. 5 is an example diagram showing a scenario of using the determining circuit 100 to determine target row addresses of different iteration periods according to an embodiment of the invention. In this embodiment, it is assumed that the hacker uses a repeated sequence of uniform pattern addresses such as {Addr1, Addr2, Addr3, Addr4, Addr5} (but not limited) to attack a memory device, and the first FIFO buffer 105 has the first table having four entries to record four addresses. In the iteration period TRP1, the first FIFO buffer 105 is empty, and the determining circuit 100 monitors all the addresses {Addr1, Addr2, Addr3, Addr4, Addr5} to finally determine the address Addr1 as the target row address of the iteration period TRP1; the determining circuit 100 outputs the address Addr1 at the end of iteration period TRP1. Then, during the iteration period TRP2, the target row refresh operation can be performed based on the address Addr1. In the iteration period TRP2, the first FIFO buffer 105 records the information of address Addr1, the input address that is equal to the address Addr1 will be discarded by the first comparison circuit 110 of the determining circuit 100, and the determining circuit 100 monitors the addresses {Addr2, Addr3, Addr4, Addr5} to finally determine the address Addr2 as the target row address of the iteration period TRP2; the determining circuit 100 outputs the address Addr2 at the end of iteration period TRP2. Then, during the iteration period TRP3, the target row refresh operation can be performed based on the address Addr2. In the iteration period TRP3, the first FIFO buffer 105 records the information of addresses Addr1 and Addr2, the input address that is equal to the address Addr1 or Addr2 will be discarded by the first comparison circuit 110 of the determining circuit 100, and the determining circuit 100 monitors the addresses {Addr3, Addr4, Addr5} to finally determine the address Addr3 as the target row address of the iteration period TRP3. The determining circuit 100 outputs the address Addr3 at the end of iteration period TRP3. The operations are similar for other iteration periods and are not detailed here for brevity.

Further, in other embodiments, a hacker may use a repeated sequence of uniform pattern addresses such as {Addr1, Addr2, Addr3, Addr4} to attack a memory device, and the first FIFO buffer may have the first table having eight entries to record eight addresses maximally. That is, the number of all entries of the first table is larger than the number of uniform pattern addresses. In this embodiment, for example, after the first table uses four entries to sequentially record information of addresses Addr1, Addr2, Addr3, Addr4 for the four iteration periods, identical addresses will be ignored and no addresses can be monitored by the determining circuit 100 since all the uniform pattern addresses Addr1, Addr2, Addr3, Addr4 have been recorded in the first table. Thus, the target row latch 120 is not updated even though the fifth iteration period ends. In this situation, for the first time that the target row latch 120 is not updated, the address information of the last one (i.e. Addr1) among all the valid addresses currently recorded in the first table is selected as the target row address of the fifth iteration period and transmitted into the first entry of the first table. Similarly, for the sixth iteration period, the target row latch 120 is not updated even though the sixth iteration period ends. In this situation, for the second time that the target row latch is not updated, the address information of the last one (i.e. Addr2)) among all the valid addresses currently recorded in the first table is selected as the target row address of the sixth iteration period and transmitted into the first entry of the first table. This is similar for the seventh iteration period and the eighth iteration period. For the seventh iteration period, the address information of the last one (i.e. Addr3)) among all the valid addresses currently recorded in the first table is selected as the target row address of the seventh iteration period and transmitted into the first entry of the first table. For the eighth iteration period, the address information of the last one (i.e. Addr4)) among all the valid addresses currently recorded in the first table is selected as the target row address of the eighth iteration period and transmitted into the first entry of the first table.

Compared to the prior art mechanism, no counter circuits are employed by a circuit for determining a target row address of an iteration period. Since a counter circuit occupies more circuit areas, the provided technical solution can save almost 50% areas compared to the prior art mechanism.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A target row refresh method, comprising:
 (a) providing and using a first first-in-first-out (FIFO) buffer used as a first table having M entries each being capable of storing information of a target row address;
 (b) providing and using a second FIFO buffer used as a second table having K entries which are respectively capable of storing information of different/identical candidate row addresses;
 (c) providing an input address register to receive an input address;
 (d) determining whether the input address in the input address register matches address information recorded in the first table;
 (e) when the input address does not match the address information recorded in the first table, determining whether to update information of a target row latch by using the input address in the input address register according to a sample policy so as to determine whether to compare the input address with address information recorded in the second table to determine a target row address; and
 (f) when the target row address is determined, performing a target row refresh operation to refresh a memory device's row(s) adjacent to a target row corresponding to the target row address.

2. The target row refresh method of claim 1, wherein the step (e) comprises:
 when the information of the target row latch is updated as the input address, performing:
  determining whether the input address in the target row latch matches more than N row addresses recorded in the second table wherein N is an integer larger than one;

updating information of an entry of the second table by using the input address if the input address in the target row latch does not match more than N row addresses recorded in the second table; and determining the input address as the target row address if the input address in the target row latch matches more than N row addresses recorded in the second table.

3. The method of claim 2, further comprising:

adjusting a value of the N to be different in different iteration periods.

4. The method of claim 1, further comprising:

when the target row latch is never updated during an iteration period, performing:

using address information recorded at the M-th entry of the first table to update address information of a first entry of the first table if the M entries of the first table all store valid address information; and using address information recorded at i-th entry of the first table to update address information of the first entry of the first table if information of the M-th, (M−1)-th, . . . , and (i+1)-th entries of the first table is empty or invalid.

5. The method of claim 1, further comprising:

clearing the address information recorded in the second table without clearing the address information recorded in the first table when an iteration period ends.

6. The method of claim 1, further comprising:

adjusting the sample policy as a consecutive sample policy or a discrete sample policy with a sample interval which can be changed in different iteration periods.

7. The method of claim 1, wherein the steps (c), (d), (e) are performed in a first iteration period, and the step (f) is performed in a second iteration period following or being next to the first iteration period.

8. A determining circuit employed in a memory device to determine a target row address to be used by a target row refresh operation to refresh row(s) adjacent to a target row of the memory device, comprising:

a first first-in-first-out (FIFO) buffer, used as a first table having M entries each being capable of storing information of a target row address;

a second FIFO buffer, used as a second table having K entries which are respectively capable of storing information of different/identical candidate row addresses;

an input address register, for receiving an input address;

a first comparison circuit, coupled between the first FIFO buffer and the input address register, for comparing the input address in the input address register with address information recorded in the first table to determine whether the input address matches the address information recorded in the first table; and a target row latch, coupled to the input address register and the second FIFO buffer, to be controlled by the determining circuit to determine whether to update information of the target row latch by sampling the input address in the input address register according to a sample policy so as to determine whether to compare the input address with address information recorded in the second table to determine a target row address when the input address does not match the address information recorded in the first table.

9. The determining circuit of claim 8, further comprising:

a second comparison circuit, coupled between the target row latch and the second FIFO buffer, for performing:

determining whether the input address in the target row latch matches more than N row addresses recorded in the second table wherein N is an integer larger than one when the information of the target row latch is updated as the input address;

updating information of an entry of the second table by using the input address if the input address in the target row latch does not match more than N row addresses recorded in the second table; and determining the input address as the target row address if the input address in the target row latch matches more than N row addresses recorded in the second table.

10. The determining circuit of claim 9, wherein a value of the N can be adjusted to be different in different iteration periods.

11. The determining circuit of claim 8, further comprising:

a multiplexer, having a first input coupled to the target row latch, a second input coupled to the first FIFO buffer, and an output;

wherein when the target row latch is updated during an iteration period, the multiplexer is controlled by the determining circuit to select the first input as the output of the multiplexer to use the target row address determined by the target row latch to update information of a first entry of the first table; when the target row latch is never updated during the iteration period and the M entries of the first table all store valid address information, the multiplexer is controlled by the determining circuit to select the second input as the output of the multiplexer to use address information recorded at the M-th entry of the first table to update address information of the first entry of the first table; and, when the target row latch is never updated during the iteration period and the M-th, (M−1)-th, . . . , (i+1)-th entries of the first table do not store valid address information, the multiplexer is controlled by the determining circuit to select the second input as the output of the multiplexer to use address information recorded at i-th entry of the first table to update address information of the first entry of the first table.

12. The determining circuit of claim 8, wherein the address information recorded in the second table is cleared and the address information recorded in the first table is not cleared when an iteration period ends.

13. The determining circuit of claim 8, wherein the sample policy is adjusted by the determining circuit as a consecutive sample policy or a discrete sample policy with a sample interval which can be changed in different iteration periods.

* * * * *